US012216170B2

(12) United States Patent
Hong et al.

(10) Patent No.: US 12,216,170 B2
(45) Date of Patent: Feb. 4, 2025

(54) DEVICE AND METHOD FOR ESTIMATING STATE OF BATTERY

(71) Applicant: MINTECH CO., LTD, Daejeon (KR)

(72) Inventors: Young Jin Hong, Daejeon (KR); Hee Kyung Myung, Daejeon (KR); Jae Hoon Lee, Gyeonggi-do (KR); Sang Eon Park, Daejeon (KR); Jae Kyu Kim, Daejeon (KR); In Jae Hwang, Daejeon (KR)

(73) Assignee: Mintech Co., Ltd, Daejeon (KR)

( * ) Notice: Subject to any disclaimer, the term of this patent is extended or adjusted under 35 U.S.C. 154(b) by 333 days.

(21) Appl. No.: 17/435,026

(22) PCT Filed: Nov. 29, 2019

(86) PCT No.: PCT/KR2019/016717
§ 371 (c)(1),
(2) Date: Aug. 30, 2021

(87) PCT Pub. No.: WO2021/107220
PCT Pub. Date: Jun. 3, 2021

(65) Prior Publication Data
US 2022/0146585 A1 May 12, 2022

(30) Foreign Application Priority Data

Nov. 29, 2019 (KR) .......... 10-2019-0156612
Nov. 29, 2019 (KR) .......... 10-2019-0156613

(51) Int. Cl.
*G01R 31/3835* (2019.01)
*G01R 31/367* (2019.01)
(Continued)

(52) U.S. Cl.
CPC ....... *G01R 31/3835* (2019.01); *G01R 31/367* (2019.01); *G01R 31/387* (2019.01); *G01R 31/392* (2019.01); *G01R 31/396* (2019.01)

(58) Field of Classification Search
None
See application file for complete search history.

(56) References Cited

U.S. PATENT DOCUMENTS 9,893,385 B1 * 2/2018 Nayar ................ H01M 10/399
2003/0038637 A1 * 2/2003 Bertness ............ H02J 7/00047
324/426

(Continued)

FOREIGN PATENT DOCUMENTS

JP        2014062829       4/2014
KR      101782527 B1      9/2017
(Continued)

OTHER PUBLICATIONS

Internation Search Report for PCT/KR2019/016717 completed Aug. 25, 2020 (3 pages).

(Continued)

*Primary Examiner* — Shelby A Turner
*Assistant Examiner* — Brandon J Becker
(74) *Attorney, Agent, or Firm* — Young Basile Hanlon & MacFarlane, P.C.

(57) ABSTRACT

A device and method of estimating state-of-health of a battery is provided. A device of estimating a state-of-health (SOH) of a battery includes: a memory configured to load a program for calculating a state-of-balance (SOB) value by voltage of a plurality of cells constituting the battery and estimating a state-of-health balance value which is a state-of-health value of the battery to which the state-of-balance value by voltage is applied; and a processor configured to execute instructions included in the program loaded by the (Continued)

memory. A device and method of estimating state-of-charge of a battery is provided. A device of estimating state-of-charge (SOC) of a battery includes: a memory configured to load a program for correcting a voltage-to-remaining capacity correlation, in which a battery voltage is matched for each remaining capacity, based on a state-of-balance value by voltage of the battery; and a processor configured to execute instructions included in the program loaded in the memory.

12 Claims, 10 Drawing Sheets

(51) Int. Cl.
  *G01R 31/387* (2019.01)
  *G01R 31/392* (2019.01)
  *G01R 31/396* (2019.01)

(56) References Cited

U.S. PATENT DOCUMENTS

| | | | |
|---|---|---|---|
| 2005/0024061 A1* | 2/2005 | Cox | G01R 31/3647 324/426 |
| 2006/0158151 A1* | 7/2006 | Kimura | H01M 10/486 320/106 |
| 2014/0084939 A1* | 3/2014 | Sejima | G01R 31/392 324/537 |
| 2016/0236578 A1* | 8/2016 | Liao | B60L 50/90 |
| 2017/0052229 A1* | 2/2017 | Eckert | H01M 10/48 |
| 2017/0054306 A1* | 2/2017 | Vo | H02J 7/0016 |
| 2019/0199106 A1* | 6/2019 | Grasshoff | H02J 7/0016 |

FOREIGN PATENT DOCUMENTS

| | | | | |
|---|---|---|---|---|
| KR | 102036876 B1 | 10/2019 | | |
| WO | WO-2012030455 A2 * | 3/2012 | | B60L 3/0046 |
| WO | WO-2018122715 A1 * | 7/2018 | | G01R 31/367 |

OTHER PUBLICATIONS

Wang, Shun-Li et al. "A comprehensive working state monitoring method for power battery packs considering state of balance and aging correction" Energy 171 . 2019 pp. 444-455. (12 pages).

Wang, Shun-Li et al. "An improved packing equivalent circuit modeling method with the cell-lo-cell consistency state evaluation of the internal connected lithium-ion batteries". Energy Science & Engineering. Mar. 5, 2019, vol. 7, Issue 2. pp. 546-556. (12 pages).

Wang, Shunli et al. "Online dynamic equalization adjustment of high-power lithium-ion battery packs based on the state of balance estimation" Applied Energy 166. 2016. pp. 44-58. (15 pages).

Korean Intellectual Property Office, Notification of Reason for Refusal for application No. 10-2019-0156613 mailed Feb. 25, 2021 (8 pages).

* cited by examiner

DEVICE AND METHOD FOR ESTIMATING STATE OF BATTERY

CROSS-REFERENCE TO RELATED APPLICATIONS

The present application is a national stage application, which claims benefit under 35U.S.C. § 365 of International Application No. PCT/KR2019/016717, entitled "DEVICE AND METHOD FOR ESTIMATING STATE OF BATTERY" and filed Nov. 29, 2019, which is hereby incorporated by reference in its entirety and which claims benefit from Korean Patent Application Serial No. 10-2019-0156612, filed Nov. 29, 2019, and from Korean Patent Application Serial No. 10-2019-0156613, filed Nov. 29, 2019.

TECHNICAL FIELD

The present disclosure relates to a device of estimating state-of-charge and state-of-health of a battery and to a method thereof.

BACKGROUND ART

A battery module or battery pack is made by combining a plurality of battery cells into one to protect against physical impact from the external environment and to perform a specific role, and is generally simply referred to as a 'battery'. For example, a representative example of the battery is a rechargeable battery installed in a smartphone, walkie-talkie, laptop, etc., and in the case of high-power consumption such as electric bicycles and electric vehicles, as few as one or two to as many as tens of batteries may be bundled together to form a single battery structure.

When the lifespan of the battery decreases, if the degree of voltage deviation of cells constituting a battery increases, overcharging or over-discharging of some cells is caused. As such, when an overcharged or over-discharged cell occurs among the cells of the battery, safety is greatly lowered, and there is a risk that may lead to a fire or explosion in an abnormal situation. In addition, when some of the cells of the battery reach an upper limit voltage or a lower limit voltage, even though there is more remaining capacity (e.g., state of charge ("SOC")), the use is limited, such that all of the capacity of the battery may not be realized.

Meanwhile, the remaining capacity of the battery, that is, the state-of-charge SOC, is a measure of indicating a fuel amount of a storage battery used in a hybrid vehicle, a battery-type electric vehicle, or the like. When the SOC is 100%, the storage battery is full, and when the SOC is 0%, the storage battery is exhausted.

In such a battery, a state-of-health SOH of the battery estimated according to a preset reference may be different from a state-of-health reflecting an unbalanced state of voltage according to the actual use of the battery. In other words, when some cells first reach the preset upper or lower voltage limit due to the unbalanced state of voltage in the battery cells, the battery may stop working although all cells have not reached the upper or lower voltage limit, and there is an issue that it may not implement all the capacity.

As a method of estimating the SOC of a conventional battery, a technique of measuring an open circuit voltage (OCV) of the battery and estimating the SOC of the battery based on the OCV are used. However, with this conventional technique, it is difficult to solve the problem caused by the unbalanced state of the battery voltage as described above when estimating the state-of-charge of the battery.

TECHNICAL OBJECTIVE

Aspects of embodiments of the present disclosure are directed to a device capable of accurately estimating state-of-health SOH of a battery by calculating state-of-balance SOB by voltage of cells constituting the battery, and by applying the SOB, and to a method thereof.

Aspects of embodiments of the present disclosure are also directed to a device capable of accurately estimating state-of-charge SOC of a battery by reflecting state-of-balance SOB by voltage of cells constituting the battery. Herein, this estimated SOC is referred to as a balance state-of-charge.

TECHNICAL MEANS

According to an embodiment, a device of estimating a state-of-health (SOH) of a battery includes: a memory configured to load a program for calculating a state-of-balance (SOB) value by voltage of a plurality of cells constituting the battery and estimating a state-of-health balance value which is a state-of-health value of the battery to which the state-of-balance value by voltage is applied; and a processor configured to execute instructions included in the program loaded by the memory.

In such an embodiment, according to executing of the program, the processor is configured to: set a voltage difference allowable limit value within a voltage difference between a fully charged-state voltage and a discharged-state voltage of the battery, set an allowable limit quantile which subclassifies, into one or more analysis sections, an allowable limit range to which the voltage difference allowable limit value is applied with respect to an average voltage value derived from measured voltage values of the cells, calculate a voltage drop rate in the allowable limit range with respect to the average voltage value, wherein a quantile drop rate based on the allowable limit quantile is calculated as the voltage drop rate, derive a quantile degree, which is a degree of the analysis section in which the measured voltage values for each cell are all included within the allowable limit quantile for a first time, calculate the state-of-balance value by voltage based on the quantile drop rate and the quantile degree, and estimate the state-of-health balance value by applying the state-of-balance value by voltage to the state-of-health value calculated based on a remaining capacity of the battery.

In some embodiments, the processor provides a user interface which allows a user to set at least one of the voltage difference allowable limit value and the allowable limit quantile.

In some embodiments, the processor is configured to: calculate a reference deviation voltage value which is a voltage difference per the allowable limit quantile, calculate a correction factor value based on a standard deviation calculated based on the average voltage and the number of cells, the reference deviation voltage value, and the quantile degree, calculate a secondary state-of-balance value by voltage obtained by adding a primary state-of-balance value by voltage, which is a state-of-balance value by voltage calculated based on the quantile drop rate and the quantile degree, to a product of the correction factor value and the quantile drop rate, and estimate the state-of-health balance value by applying the secondary state-of-health balance value by voltage to the state-of-health value.

In some embodiments, in calculating of the secondary state-of-health balance value by voltage, the processor is configured to: when the calculated correction factor value is negative, change the calculated correction factor value to a zero (0) value and apply it, and when the calculated correction factor value is positive, apply the calculated correction factor value as it is.

In some embodiments, the processor is configured to: set the voltage difference allowable limit value to be greater than a value obtained by dividing an operation voltage range value which is a difference between the fully charged-state voltage and the discharged-state voltage by the number of the plurality of cells and smaller than a value obtained by dividing the operation voltage range value by two.

In some embodiments, the processor is configured to: sequentially increase the quantile degree, which is a variable, in units of integer within a range from 1 to the allowable limit quantile, calculate a range from a value obtained by subtracting, from the average voltage value, a product of the quantile degree and a value obtained by dividing the voltage difference allowable limit value by the allowable limit quantile, to a value obtained by adding the product thereof to the average voltage value, derive a quantile degree in which the measured voltages for each cell are all included within the calculated range for the first time, and calculate the state-of-balance value by voltage based on the derived quantile degree.

In some embodiments, the processor is configured to: when the measured voltages for each cell are not all included within the calculated range while the quantile degree, which is a variable, increases to the allowable limit quantile, determine the state-of-balance value by voltage to be zero (0).

According to an embodiment, a method of estimating state-of-health (SOH) of a battery by a device of estimating state-of-health of a battery includes: setting a voltage difference allowable limit value within a voltage difference between a fully charged-state voltage and a discharged-state voltage of a battery including a plurality of batteries; setting an allowable limit quantile which subclassifies, into one or more analysis sections, an allowable limit range to which the voltage difference allowable limit value is applied with respect to an average voltage value derived from measured voltage values of the cells; calculating a voltage drop rate in the allowable limit range with respect to the average voltage value, wherein a quantile drop rate based on the allowable limit quantile is calculated as the voltage drop rate; deriving a quantile degree, which is a degree of the analysis section in which the measured voltage values for each cell are all included within the allowable limit quantile for a first time; calculating the state-of-balance value by voltage based on the quantile drop rate and the quantile degree; and estimating a state-of-health balance value by applying the state-of-balance value by voltage to the state-of-health value calculated based on a remaining capacity SOC of the battery.

In some embodiments, the method further includes: before setting of the voltage difference allowable limit value, providing a user interface which allows a user to set at least one of the voltage difference allowable limit value and the allowable limit quantile; and receiving an input of at least one of the voltage difference allowable limit value and the allowable limit quantile through the user interface.

In some embodiments, the estimating of the state-of-health balance value includes: calculating a reference deviation voltage value which is a voltage difference per the allowable limit quantile, calculating a correction factor value based on a standard deviation calculated based on the average voltage and the number of cells, the reference deviation voltage value, and the quantile degree, calculating a secondary state-of-balance value by voltage obtained by adding a primary state-of-balance value by voltage, which is a state-of-balance value by voltage calculated based on the quantile drop rate and the quantile degree, to a product of the correction factor value and the quantile drop rate, and estimating the state-of-health balance value by applying the secondary state-of-health balance value by voltage to the state-of-health value.

According to an embodiment, a device of estimating state-of-charge (SOC) of a battery includes: a memory configured to load a program for correcting a voltage-to-remaining capacity correlation, in which a battery voltage is matched for each remaining capacity, based on a state-of-balance value by voltage of the battery; and a processor configured to execute instructions included in the program loaded in the memory.

In such an embodiment, according to executing of the program, the processor is configured to: estimate a state-of-charge to which a state-of-balance by voltage of the battery is applied based on a previous voltage-to-remaining capacity correlation table, which is basis of correction, and an actual measured voltage of the battery including a plurality of cells, and reflect the estimated state-of-charge to correct a battery voltage value corresponding to each remaining capacity in the previous voltage-to-remaining capacity correlation table and generate a new voltage-to-remaining capacity correlation table.

In some embodiments, the processor is configured to: derive a maximum cell voltage, a minimum cell voltage, and an average cell voltage from the measured voltages for each cell of the battery, and derive a maximum cell remaining capacity, a minimum cell remaining capacity and an average cell remaining capacity corresponding to the maximum cell voltage, the minimum cell voltage, and the average cell voltage, respectively, based on the previous voltage-to-remaining capacity correlation table; calculate a charge balance factor based on the maximum cell remaining capacity and the average cell remaining capacity; calculate a discharge balance factor based on the average cell remaining capacity and the minimum cell remaining capacity; and correct the battery voltage value corresponding to each remaining capacity in the previous voltage-to-remaining capacity correlation table based on a reference voltage corresponding to a preset reference remaining capacity, the measured voltage of the battery, the charge balance factor, and the discharge balance factor.

In some embodiments, the processor is configured to set the reference remaining capacity and the reference voltage which are reference for classifying charge and discharge periods of the battery from a standard voltage-to-remaining capacity correlation table in which a preset standard voltage is matched for each remaining capacity.

In some embodiments, the processor provides a user interface which allows a user to set the reference remaining capacity.

In some embodiments, the processor is configured to: when a magnitude of the actual measured voltage of the battery exceeds the reference voltage, calculate the charge balance factor based on the battery voltage value measured at a charge upper limit level according to the previous voltage-to-remaining capacity correlation table; and when the magnitude of the actual measured voltage is less than the reference voltage, calculate the discharge balance factor based on the battery voltage value measured at a discharge lower limit level according to the previous voltage-to-remaining capacity correlation table.

According to an embodiment, a method of estimating state-of-charge (SOC) of a battery includes: deriving a maximum cell voltage, a minimum cell voltage, and an average cell voltage from the measured voltages for each cell of the battery; deriving a maximum cell remaining capacity, a minimum cell remaining capacity and an average cell remaining capacity corresponding to the maximum cell voltage, the minimum cell voltage, and the average cell voltage, respectively, based on a preset previous voltage-to-remaining capacity correlation table calculating a charge balance factor based on the maximum cell remaining capacity and the average cell remaining capacity; calculating a discharge balance factor based on the average cell remaining capacity and the minimum cell remaining capacity; and estimating a state-of-charge according to a state-of-balance (SOB) by voltage of the battery based on a reference voltage corresponding to a preset reference remaining capacity, a measured voltage of the battery, the charge balance factor, and the discharge balance factor; and reflecting the estimated state-of-charge to correct a battery voltage value corresponding to each remaining capacity in the previous voltage-to-remaining capacity correlation table and generate a new voltage-to-remaining capacity correlation table.

In some embodiments, the reference remaining capacity and the reference voltage which are reference for classifying charge and discharge periods of the battery from a standard voltage-to-remaining capacity correlation table in which a preset standard voltage is matched for each remaining capacity.

In some embodiments, the method further includes: providing a user interface which allows a user to set the reference remaining capacity.

In some embodiments, when a magnitude of the actual measured voltage of the battery exceeds the reference voltage, the charge balance factor is calculated based on the battery voltage value measured at a charge upper limit level according to the previous voltage-to-remaining capacity correlation table; and 'when the magnitude of the actual measured voltage is less than the reference voltage, the discharge balance factor is calculated based on the battery voltage value measured at a discharge lower limit level according to the previous voltage-to-remaining capacity correlation table.

Effects of the Invention

According to an embodiment of the present disclosure, the degree of voltage balance between battery cells may be managed at all times, and a battery of which the degree of voltage balance of cells has broken may be predicted and dealt with in advance before reaching a dangerous situation.

In addition, according to another embodiment of the present disclosure, based on an initial value of a voltage-SOC standard table in which a state-of-charge of a battery is estimated by measuring a battery voltage, an end cell voltage, and a temperature, the voltage-SOC table may be corrected and a state-of-health SOH of the battery may be calculated by using voltage data of the battery measured in real time, and accordingly, it is possible to estimate, based on them, the state-of-charge SOC when the battery is in use, and accordingly, the state-of-charge of the battery may be estimated and provided more accurately.

MODES FOR CARRYING OUT THE INVENTION

Hereinafter, embodiments of a device and a method according to the present disclosure will be described with reference to the accompanying drawings. Herein, the present disclosure is not limited or constrained by the following examples. In addition, in describing the present disclosure, detailed descriptions of well-known functions or configurations may be omitted to clarify the gist of the present disclosure.

Figure 1:
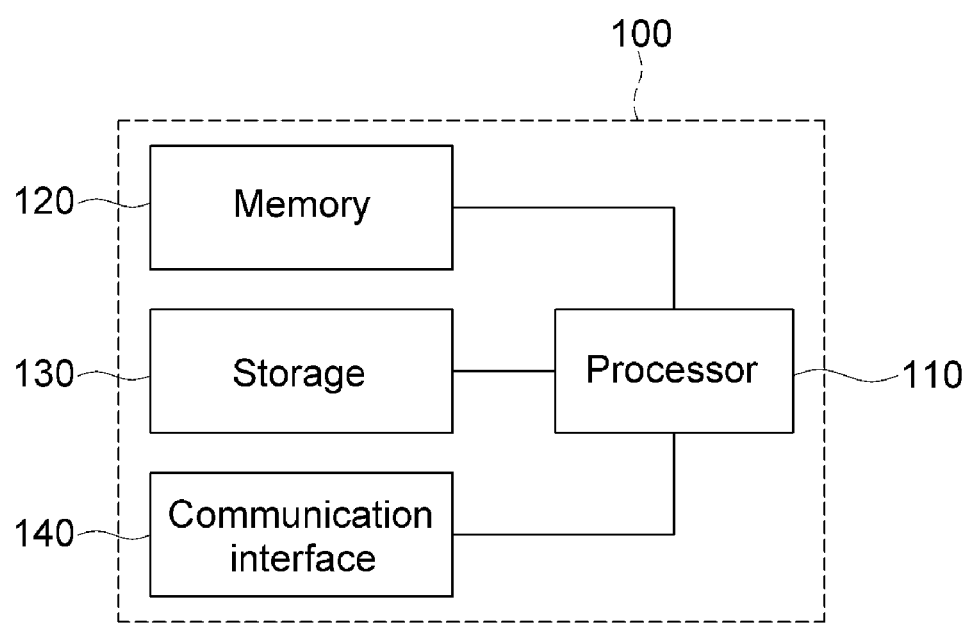
FIG. 1 is a block diagram illustrating a device of estimating a state-of-health SOH of a battery according to an embodiment of the present disclosure.

FIG. 1 is a block diagram illustrating a device of estimating a state-of-health (e.g., lifespan state) of a battery according to an embodiment of the present disclosure.

A device 100 of estimating a state-of-health SOH of a battery illustrated in FIG. 1 may be a computing device operated by at least one processor. In addition, the device 100 of estimating a state-of-health SOH may execute a program including instructions provided to execute an operation according to an embodiment of the present disclosure.

As illustrated in FIG. 1, a hardware of the device 100 of estimating a state-of-health of a battery may include at least one processor 110, a memory 120, a storage 130, and a communication interface 140, and each of the components may be connected via a bus. In addition, the device 100 of estimating a state-of-health of a battery may further include an additional hardware such as an input device and an output device.

In addition, in the device 100 of estimating a state-of-health of a battery, various software including an operating system capable of driving the program may be loaded in a storage device such as the storage 130.

The processor 110 is a device for controlling operation of the computing device 100, and may be various types of processors (e.g., a central processing unit (CPU), a microprocessor unit (MPU), a micro controller unit (MCU), and a graphic processing unit (GPU)) to execute instructions included in the program.

The memory 120 may load a corresponding program so that the instructions written to execute an operation according to the present disclosure may be processed by the processor 110.

For example, the memory 120 may be a read only memory (ROM), a random access memory (RAM), or the like.

The storage 130 may store various data and programs required to execute the operation according to the present disclosure. In such a case, the storage 130 matches a result data processed according to the execution of the program with a measurement data input through a previously interlocked or connected device (e.g., a battery management system (BMS), etc.) for each battery, and may store it as a database.

The communication interface 140 may be a wired/wireless communication module that processes communication between each component of the computing device 100 and communication with an externally interlocked device.

Figure 2:
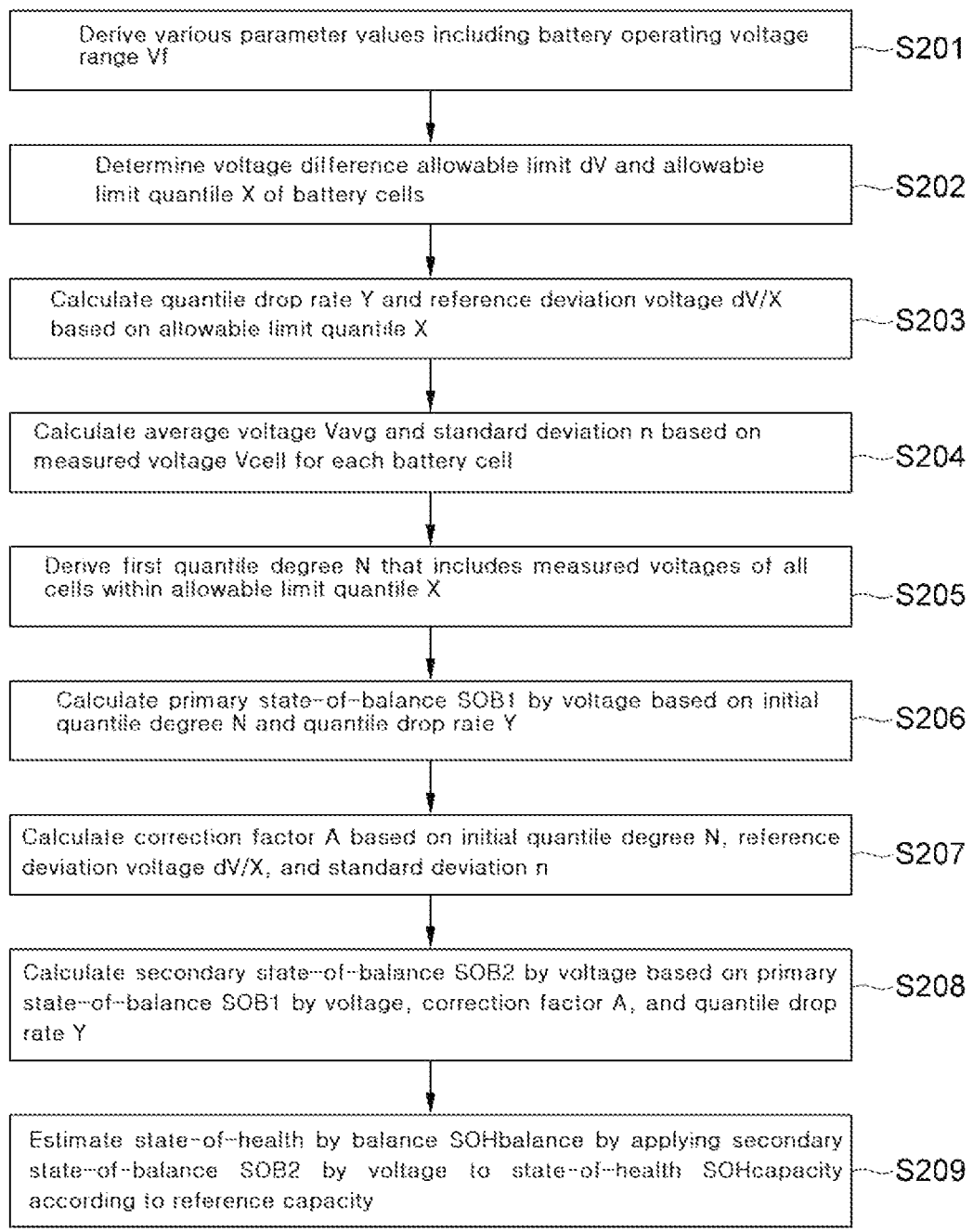
FIG. 2 is a flowchart for explaining a method of estimating a state-of-health of a battery based on the degree of voltage balancing according to an embodiment of the present disclosure.
Figure 3:
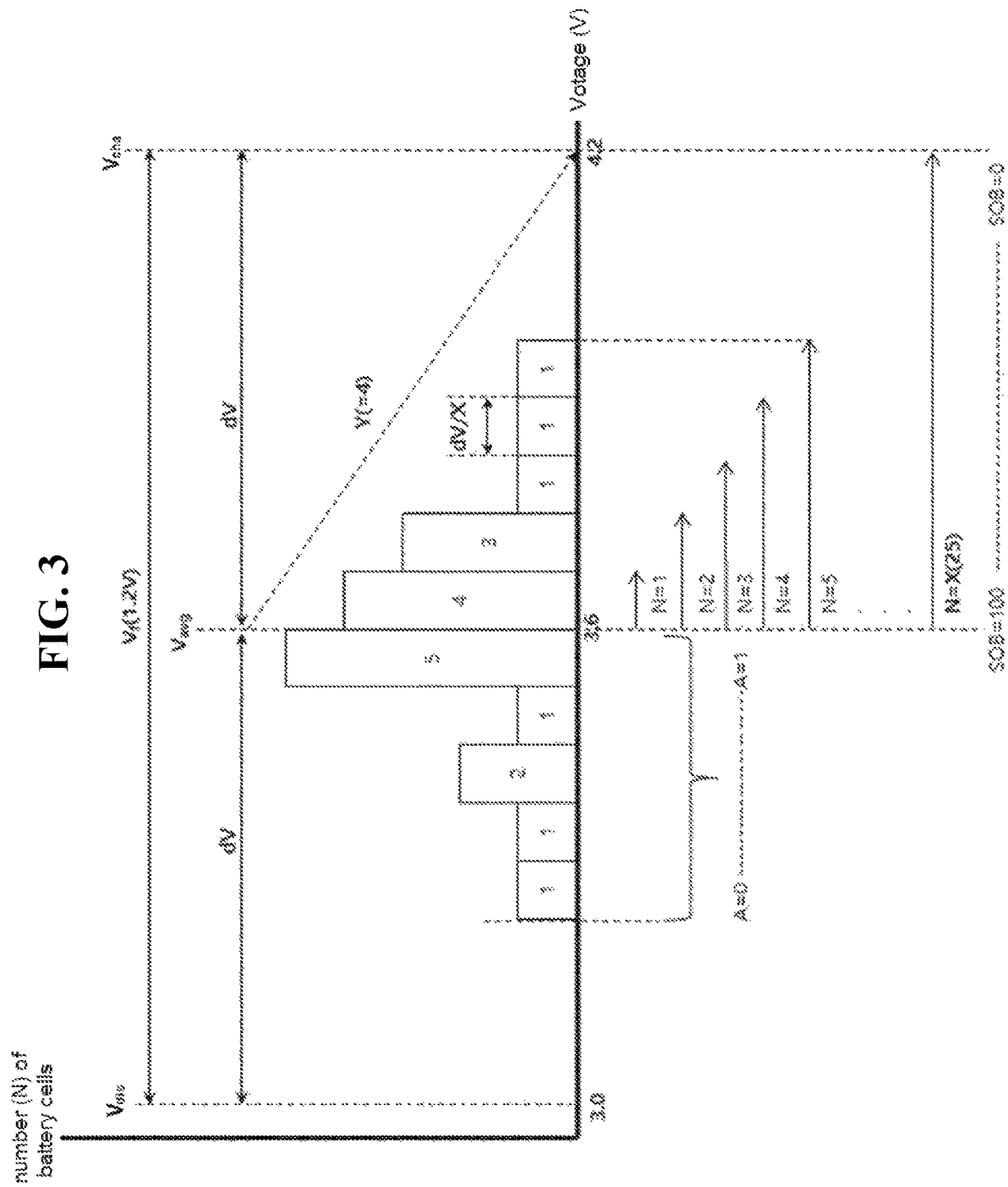
FIG. 3 illustrates an example of a graph for explaining a method of estimating a state-of-health of a battery reflecting a state-of-balance SOB by cell voltage according to an embodiment of the present disclosure.

FIG. 2 is a flowchart for explaining a process of estimating, by the device 100 of estimating a state-of-health of a battery, the state-of-health of the battery based on the degree of voltage balancing according to an embodiment of the present disclosure. FIG. 3 illustrates an example of a graph for explaining a method of estimating a state-of-health of a battery reflecting a state-of-balance SOB value by cell voltage according to an embodiment of the present disclosure.

The device 100 of estimating a state-of-health of a battery according to an embodiment of the present disclosure may calculate a state-of-balance by voltage $SOB_{voltage}$ among battery cells and calculate a state-of-health by balance $SOH_{balance}$ in which the state-of-balance by voltage $SOB_{voltage}$ of battery cells is applied to a reference state-of-health $SOH_{capacity}$ according to a thermodynamic reference capacity (e.g., state of charge, SOC) for the battery.

In a battery including a plurality of end cells (e.g., cells), the state-of-balance SOB by voltage is a factor indicating the degree of voltage balancing (e.g., evenness) of the end cells. That is, with the SOB by voltage, it may be identified that how much a voltage state of each end cell of the battery differs from an average voltage at an arbitrary point in time.

By calculating the state-of-health by balance $SOH_{balance}$ to which the actual state-of-balance by voltage among the cells is applied, it is possible to estimate the state-of-health of a battery more accurately under the actual use environment. That is, while the conventional scheme of estimating state-of-health of a battery was limited only to information such as the average voltage value and standard deviation of cells, a method of estimating state-of-health of a battery according to an embodiment of the present disclosure may estimate the state-of-health up to the extent of considering whether the state-of-balance by voltage among battery cells is in the level for safety battery operation.

Referring to FIG. 2, the processor 110 may process the following operations by executing a series of instructions included in the program, and, through this, may estimate and output the state-of-health by balance $SOH_{balance}$ of a battery in which the state-of-balance by voltage of the battery cells is reflected.

First, values of preset parameters are derived based on basic information among battery-specific information having stored in the storage 140, and measurement information which is actually measured (S201).

In such a case, the preset parameters may include, for example, a 'fully charged-state voltage $V_{cha}$' applied to the battery end cells, a 'discharged-state voltage Va.' applied to the battery end cells, a 'maximum voltage $V_{max}$' among the measured voltages of each battery end cell, and a 'minimum voltage $V_{min}$' among the measured voltages of each battery end cell, an 'average voltage $V_{avg}$' for the measured voltages of the battery end cells, the 'number n' of the end cells constituting the battery, a maximum 'operation voltage range $V_f$' of the battery, and a 'voltage standard deviation σn' for the battery end cells.

Specifically, a voltage range in which the battery may be used, that is, the maximum operation voltage range $V_f$ may be defined as in Equation 1 below.

$$V_f: V_f = (V_{cha} - V_{dis}) \qquad \text{<Equation 1>}$$

As described above, $V_{cha}$ is the fully charged-state voltage of the end cells constituting the battery, and $V_{dis}$ is the discharged-state voltage of the end cells. That is, a difference between the maximum charge voltage and the maximum discharge voltage of the battery may be defined as a voltage range value $V_f$ in which the battery may be used.

The battery operation voltage range $V_f$ defined as above is calculated.

For example, referring to FIG. 3, when the fully charged-state voltage $V_{cha}$ is set to 4.2V and the discharged-state voltage $V_{dis}$ is set to 3.0V in an arbitrary lithium ion battery, the operation voltage range $V_f$ may be calculated as 1.2V.

Based on each parameter derived as described above, the following two parameters dV and X are determined in order to estimate the state-of-balance SOB value by voltage for the end cells of the corresponding battery (S202).

A limit that may allow to the maximum a voltage difference between the end cells within the previously determined operation voltage range $V_f$, that is, a voltage difference allowable limit dV, is determined. The voltage difference allowable limit dV is a parameter that may also be designated by a user to set an appropriate state-of-balance SOB range by voltage, and the range value is not limited.

In such a case, the processor 110 may provide a user interface which allows a user (e.g., a battery examiner or a battery use system designer, etc.) to select a voltage difference allowable limit dV. The user interface provided through the processor 110 may be a concept including a graphical user interface (GUI).

As such, the value of the voltage difference allowable limit dV may be input in real time or in advance through the user interface provided by the processor 110, and this user interface may include a recommended value for the voltage difference allowable limit dV, so that the user may select one of the recommended dV values appropriate to a desired degree of battery cell state-of-balance by voltage.

The voltage difference allowable limit dV may be determined according to the condition of Equation 2 below.

$$dV: \frac{V_f}{n} \leq dV \leq \frac{V_f}{2} \qquad \text{<Equation 2>}$$

That is, the voltage difference allowable limit dV among the battery end cells may be set to be equal to or greater than a value obtained by dividing the operation voltage range $V_f$ by the number of end cells n, but not to exceed 0.5 times the operation voltage range.

In the case of a lithium ion battery according to an example of FIG. 3, it is shown that the operation voltage range $V_f$ is 1.2V, and the value of the voltage difference allowable limit dV is determined to be "1.2V/2=0.6V", which is the maximum value within the voltage difference allowable limit range. FIG. 3 shows as an example that dV is $V_f/2$, which is the maximum value, but embodiments of the present disclosure are not limited thereto, and the narrower the allowable limit range in which dV is applied with respect to the average voltage $V_{avg}$, the greater the efficiency of applying the state-of-balance by voltage.

Referring to FIG. 3, the average voltage $V_{avg}$ derived from the measured voltages of the end cells is 3.6V, and ranges up to 0.6V in the negative direction and 0.6V in the positive direction with respect to the average voltage $V_{avg}$ may each be determined as the voltage difference allowable limit.

Next, in order to determine a balancing accuracy of dispersion within the voltage difference allowable limit range, an allowable limit quantile X, which is the number of analysis sections within the voltage difference allowable limit range, is determined.

For example, the allowable limit quantile X may be determined according to the condition of Equation 3 below.

$$X: 3 \leq X \leq n^2 \qquad \text{<Equation 3>}$$

As in Equation 3, the allowable limit quantile X may be set to a number equal to or less than the square of the number n of end cells which is 3 or more.

In such a case, the processor 110 may provide a user interface which allows a user (e.g., a battery examiner or a battery use system designer, etc.) to select the number of allowable limit quantiles X.

The user interface provided through the processor 110 may be a concept including a graphical user interface (GUI). As such, the value of the allowable limit quantile X may be input in real time or in advance through the user interface provided by the processor 110, and the user interface may include a recommended value for the allowable limit quantile X, so that the user may select a value for X appropriate to a desired accuracy among the recommended X.

As such, with the voltage difference allowable limit range dV and the allowable limit quantile X determined, a quantile drop rate Y is determined (S203). The quantile drop rate Y means a voltage drop rate within the allowable limit range with respect to the average voltage.

For example, the quantile drop rate Y may be defined as in Equation 4 below.

$$Y: Y=100/X \qquad \text{<Equation 4>}$$

In the lithium ion battery according to the example of FIG. 3, when the allowable limit quantile X is determined to be 25, the quantile drop rate Y is 4.

In addition, in the lithium ion battery according to the example of FIG. 3, since the operation voltage range $V_f$ is 1.2V and the voltage difference allowable limit dV is 0.6V, a reference deviation voltage dV/X, which means a voltage difference per allowable limit quantile, may be calculated as "0.6/25=0.024".

Then, the average voltage $V_{avg}$ and the standard deviation σn are calculated based on the measured voltage values $V_{cell}$ of each of the end cells V1 to Vn of the battery.

For example, the standard deviation σn may be calculated using Equation 5 below.

$$\sigma n = \sqrt{\frac{\sum (Vn - V_{avg})^2}{n}} \qquad \text{< Equation 5 >}$$

In the lithium ion battery according to the example of FIG. 3, the average voltage $V_{avg}$ calculated based on the measured voltage $V_{cell}$ measured for each cell (e.g., end cell) is 3.6V, so the standard deviation σn may be calculated as 0.187.

Next, a quantile degree N including all voltage values of each measured cell is calculated (S205). The quantile degree N means an integer that sequentially increases from 1 to the allowable limit quantile X.

In such a case, the quantile degree N may be determined using Equation 6 below.

$$V_{avg} \pm N(dV/X) \qquad \text{<Equation 6>}$$

As shown in Equation 6, the quantile degree N may be determined based on the average voltage value $V_{avg}$ of the end cells and the reference deviation voltage dV/X.

In the lithium ion battery according to the example of FIG. 3, when the average voltage $V_{avg}$ is 3.6V and the reference deviation voltage dV/X is 0.024, a first quantile degree N including the measured voltages of all the cells may be 5.

Specifically, a first quantile degree N including the voltage values of all individual cells (e.g., end cells) may be calculated by calculating the number of $V_{cell}$ that satisfy the condition of Equation 7 below when the quantile degree N, which is a variable, is sequentially increased from 1 to X in units of integer.

$$V_{avg}-N(dV/X) \leq V_{cell} \leq V_{avg}+N(dV/X) \qquad \text{<Equation 7>}$$

When the result value in Equation 6 is expressed in percentages with respect to n, it is possible to derive the quantile degree N that first becomes 100 (that is, the measured voltages of all end cells are included within the range). That is, the first quantile degree N including the measured voltages of all end cells within a range of the allowable limit dV determined from the average voltage $V_{avg}$ while classifying the quantile by increasing the quantile degree N by 1.

Next, a state-of-balance value by voltage $SOB_{voltage}$ for the end cells is calculated based on the quantile degree N calculated through Equations 6 and 7 (S206).

A primary state-of-balance value by voltage $SOB1_{voltage}$ may be calculated using Equation 8 below.

$$SOB1_{voltage}=(100-Y*N) \qquad \text{<Equation 8>}$$

For reference, when the quantile N, which is a variable, is expressed as a percentage with respect to n until it becomes X, in a case where there is no quantile degree that first becomes 100, $SOB1_{voltage}$ is determined to be 0.

On the other hand, when the quantile N, which is a variable, is expressed as a percentage with respect to n until it becomes X, in a case where the quantile degree N that first becomes 100 is any one of 1 to X, $SOB1_{voltage}$ is calculated as 100−Y*N as in Equation 8, and Y=100/X.

In the lithium ion battery according to the example of FIG. 3, the quantile degree N is 10 and Y is 4, so $SOB1_{voltage}$ is calculated as "100−4*10", which is 60.

Then, a balance correction factor A within the quantile is calculated based on the standard deviation σn and the reference deviation voltage dV/X (S207), and a secondary state-of-balance value by voltage $SOB2_{voltage}$ is calculated using the correction factor A (S208).

The correction factor A may be obtained using Equation 9 below, and the secondary state-of-balance value by voltage $SOB2_{voltage}$ may be obtained using Equation 10.

$$A = \frac{(N^*dV/X) - \sigma n}{(N^*dV/X)} \quad <\text{Equation 9}>$$

The correction factor A is a balance correction factor for each quantile.

In the lithium ion battery according to the example of FIG. 3, the quantile degree N is 10, the reference deviation voltage dV/X is 0.024, and the standard deviation σn is 0.187, so the correction factor A is determined to be "(10*0.024−0.187)/(10*0.024)", which is 0.22.

$$SOB2_{voltage} = SOB1_{voltage} + A'^*Y \quad <\text{Equation 10}>$$

As shown in Equation 10, the secondary state-of-balance value by voltage $SOB2_{voltage}$ is calculated based on the primary state-of-balance value by voltage $SOB1_{voltage}$ and a product (e.g., multiplication) of the correction factor A and the quantile drop rate Y. In such a case, when the correction factor A is negative, A' is set to 0, and when the value of A is positive, A' is set to the value A.

In the lithium ion battery according to the example of FIG. 3, the correction factor A is a positive number of 0.22, and A' is set to 0.22, and accordingly, the secondary state-of-balance value by voltage $SOB2_{voltage}$ is determined as "60+4*0.22", which is "60.88".

Next, by correcting the state-of-health SOH of the battery using the secondary state-of-balance value by voltage $SOB2_{voltage}$, a state-of-health by balance $SOH_{balance}$ to which the state-of-balance by voltage is applied is calculated (S209).

The state-of-health $SOH_{balance}$ of a battery to which the state-of-balance by voltage of the battery is applied may be calculated using Equation 11 below.

$$P\ SOH_{balance} = SOB2_{voltage} * SOH_{capacity} \quad <\text{Equation 11}>$$

In such a case, $SOH_{capacity}$ represents the lifespan with respect to the remaining capacity (e.g., SOC) of the battery, and $SOH_{balance}$ represents the lifespan obtained by applying the state-of-balance by voltage to the lifespan with respect to the remaining capacity of the battery.

In the lithium ion battery according to the example of FIG. 3, when the state-of-health $SOH_{capacity}$ based on the thermodynamic reference capacity (e.g., the remaining capacity SOC) of the corresponding lithium ion battery (e.g., the battery) is 90%, $SOB2_{voltage}$, which is a final state-of-balance value by voltage to which the correction factor A is reflected, is 60.88, and the state-of-health by balance $SOH_{balance}$ is "60.88*90/100", which is calculated as "54.79%".

As described above, the state-of-balance of the cells of the corresponding battery may not be accurately expressed using only the average value and the standard deviation, and accordingly, as the user sets the reference deviation for the desired level of accuracy and precision and sets the quantile within the corresponding reference deviation, the state-of-health of a battery to which a more accurate state-of-balance by voltage is applied may be estimated.

Figure 4:
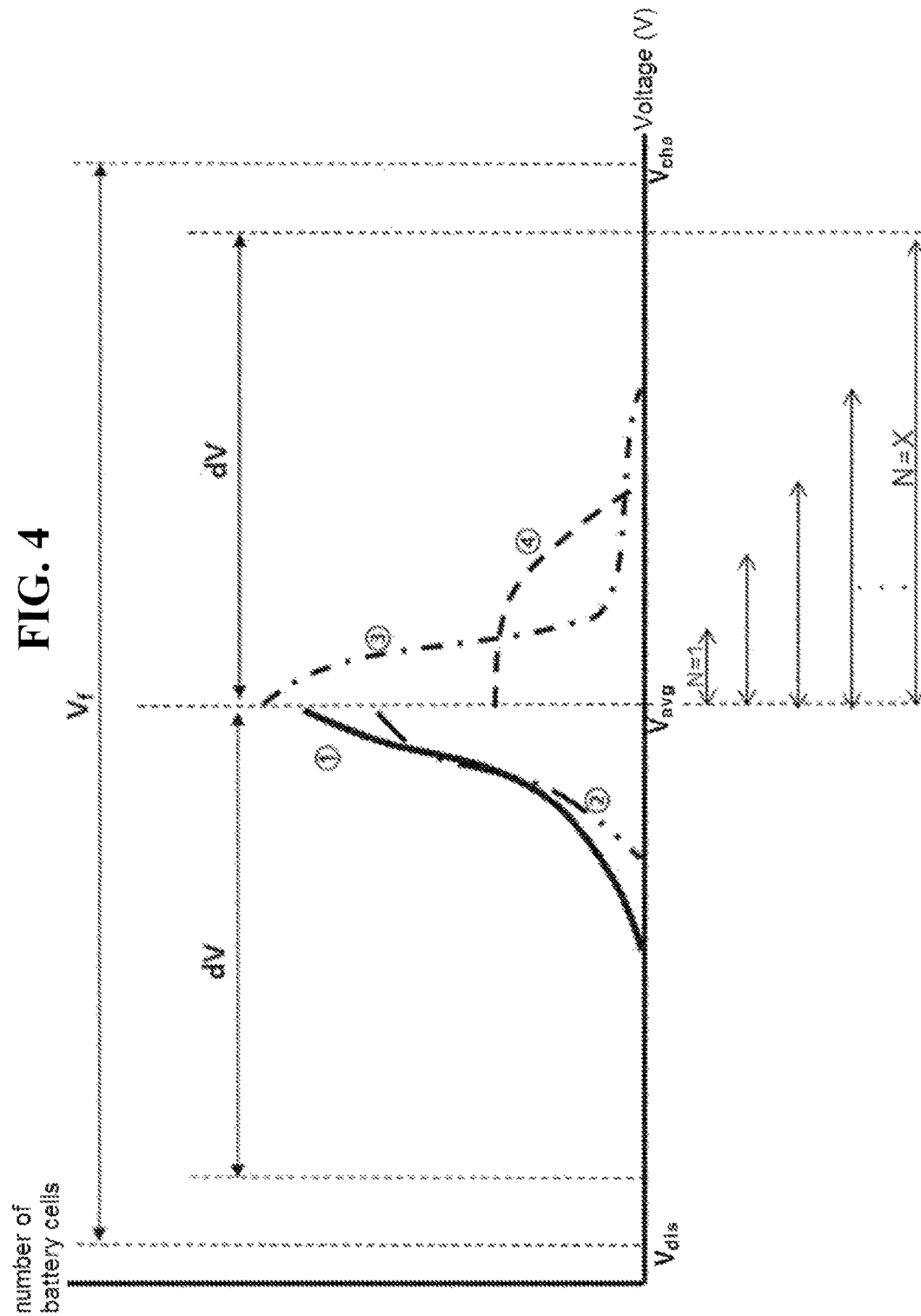
FIG. 4 illustrates an example of a graph comparing state-of-balance values by voltage of a plurality of battery cells.

FIG. 4 illustrates an example of a graph comparing state-of-balance values by voltage of a plurality of battery cells.

Referring to FIG. 4, first to fourth state-of-balance by voltage ① to ④ of battery cells are illustrated, and it may be appreciated that the state-of-balance SOB by voltage has a higher value, that is, higher safety and efficiency, in the order of the second state-of-balance by voltage ② of battery cells, the first state-of-health by voltage ① of battery cells, the fourth state-of-balance by voltage ④ of battery cells, and the third state-of-balance by voltage ③ of battery cells.

Specifically, in FIG. 4, although it seems that the number of battery cells close to the average voltage $V_{avg}$ is large in the first state-of-balance by voltage ①, it may be appreciated that the first state-of-balance by voltage ① has a higher quantile degree N than the quantile degree N of the second state-of-balance by voltage ②. That is, it may be appreciated that there is a battery cell having a measured voltage farther away from the average voltage $V_{avg}$ within the voltage difference allowable limit dV in the first state-of-balance value by voltage ① compared to the second state-of-balance value by voltage ②.

As such, although there are a number of cells having good voltage charge/discharge capability among the battery cells, if there are even a small number of battery cells having a larger voltage difference than the corresponding cells, the state-of-balance SOB by voltage may be relatively lower than that of a battery in which the voltage charge/discharge capability of the battery cells is somewhat lower, but the voltage difference between the cells is evenly distributed (e.g., the degree of state-of-balance by voltage is high).

Figure 5:
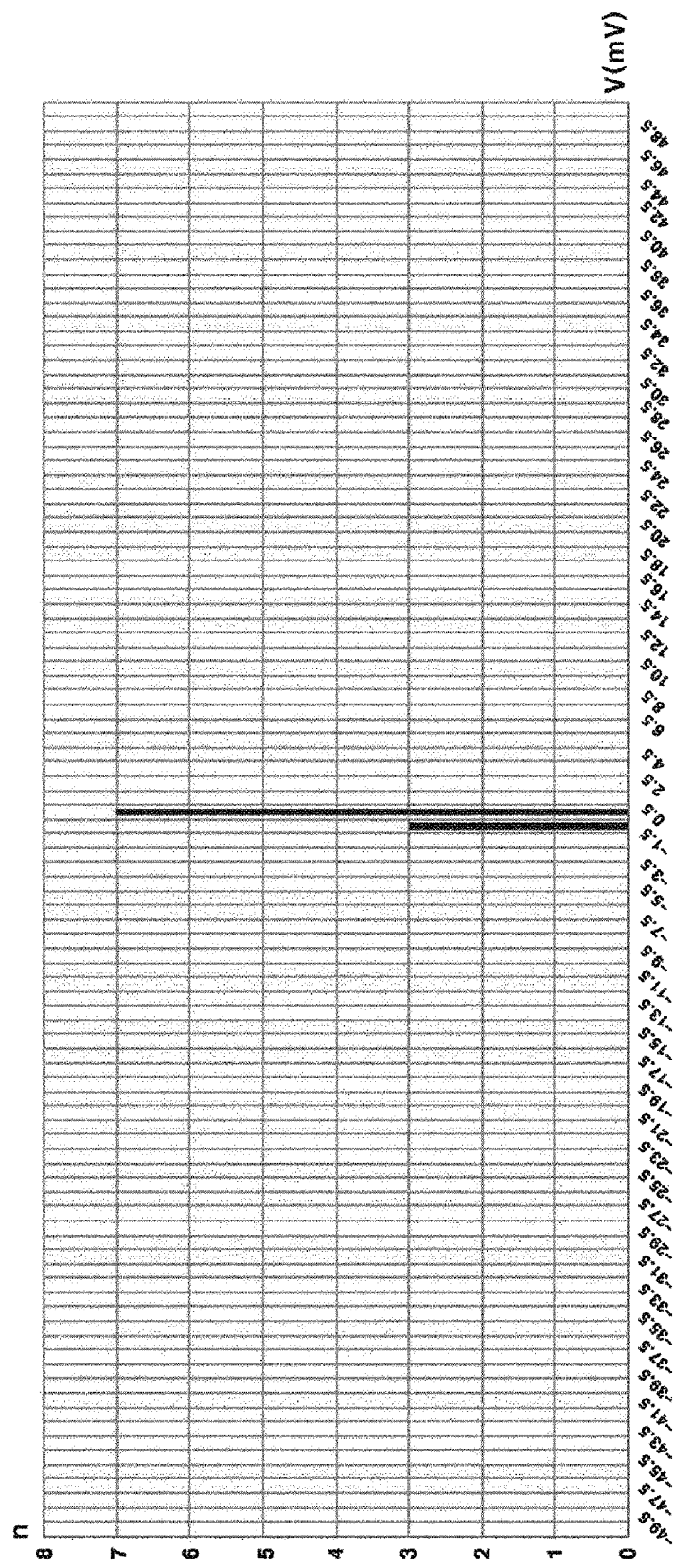
FIGS. 5 and 6 are examples each illustrating the result of calculating a state-of-balance value by cell voltage according to an embodiment of the present disclosure.
Figure 6:
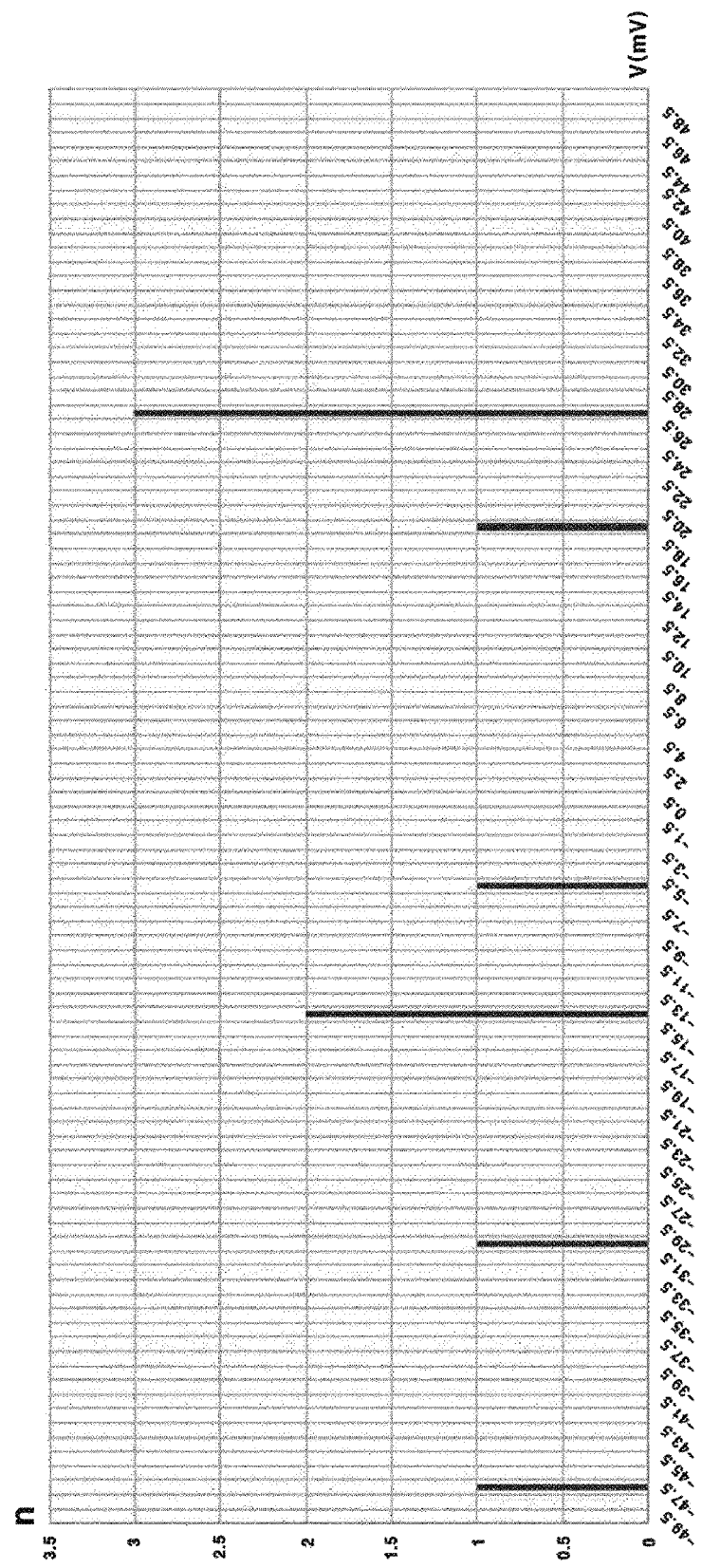

FIGS. 5 and 6 are examples each illustrating the result of calculating a state-of-balance by cell voltage according to an embodiment of the present disclosure.

In FIGS. 5 and 6, the results of deriving the state-of-balance values by voltage of different batteries are shown so that they may be compared.

In such a case, a state that a first battery of FIG. 5 and a second battery of FIG. 6 each have 10 cells (e.g., end cells), and the user sets the allowable limit difference dV to 0.6V, and sets the allowable limit quantile X to 50 is shown as an example.

First, a state-of-balance SOB by voltage of the first battery will be described with reference to FIG. 5 and Table 1 below.

TABLE 1

| Measured voltage of end cells | | | | | | | | | |
|---|---|---|---|---|---|---|---|---|---|
| V (1) | V (2) | V (3) | V (4) | V (5) | V (6) | V (7) | V (8) | V (9) | V (10) |
| 3.706 | 3.711 | 3.712 | 3.712 | 3.712 | 3.71 | 3.712 | 3.712 | 3.711 | 3.709 |

| Various parameters | | | | | | | | | |
|---|---|---|---|---|---|---|---|---|---|
| $V_{cha}$ | $V_{dis}$ | $V_{max}$ | $V_{min}$ | $V_{avg}$ | dV | $V_{max}-V_{min}$ | $V_{avg}-V_{max}$ | SOB = 0 ? | SOB = 100 ? |
| 4.2 | 3 | 3.712 | 3.706 | 3.7107 | 0.6 | 0.0013 | 0.0047 | NO | NO |
| X | dV/X | Stdev | N | Y | SOB1 | A | A' | SOB2 | |
| 50 | 0.012 | 0.00185 | 1 | 2 | 98 | 0.84612 | 0.84612 | 99.6922 | |

TABLE 1-continued

| Cell including rate for each quantile section | | | | | | | | | |
|---|---|---|---|---|---|---|---|---|---|
| 1 section | 2 section | 3 section | 4 section | 5 section | 6 section | 7 section | 8 section | 9 section | 10 section |
| 100 | 100 | 100 | 100 | 100 | 100 | 100 | 100 | 100 | 100 |
| 11 section | 12 section | 13 section | 14 section | 15 section | 16 section | 17 section | 18 section | 19 section | 20 section |
| 100 | 100 | 100 | 100 | 100 | 100 | 100 | 100 | 100 | 100 |
| 21 section | 22 section | 23 section | 24 section | 25 section | 26 section | 27 section | 28 section | 29 section | 30 section |
| 100 | 100 | 100 | 100 | 100 | 100 | 100 | 100 | 100 | 100 |
| 31 section | 32 section | 33 section | 34 section | 35 section | 36 section | 37 section | 38 section | 39 section | 40 section |
| 100 | 100 | 100 | 100 | 100 | 100 | 100 | 100 | 100 | 100 |
| 41 section | 42 section | 43 section | 44 section | 45 section | 46 section | 47 section | 48 section | 49 section | 50 section |
| 100 | 100 | 100 | 100 | 100 | 100 | 100 | 100 | 100 | 100 |

Referring to Table 1, it may be appreciated that a difference between the maximum voltage $V_{max}$ and the minimum voltage $V_{min}$ among the measured voltages for each cell of the first battery is 0.0013, and the measured voltages of all cells are all included in a first section of the quantile section. If the method described through FIGS. 2 to 4 is applied, the primary state-of-balance by voltage SOB1 is calculated as a value of 98, and SOB2 obtained by applying the correction factor to SOB1 is calculated as 99.6922. Accordingly, a value of 99.69% of the state-of-health SOH based on the remaining capacity of the first battery may be estimated as the state-of-health by balance $SOH_{balance}$.

Referring to FIG. 5, it may be appreciated that all of the battery cells of the first battery exist within a narrow range with respect to the average voltage, and the state-of-balance value by voltage is very high.

Next, a state-of-balance SOB by voltage of the second battery will be described with reference to FIG. 6 and Table 2 below.

TABLE 2

| Measured voltage of end cells | | | | | | | | | |
|---|---|---|---|---|---|---|---|---|---|
| V (1) | V (2) | V (3) | V (4) | V (5) | V (6) | V (7) | V (8) | V (9) | V (10) |
| 3.2 | 3.4 | 3.6 | 3.6 | 3.7 | 3.9 | 4 | 4.1 | 4.1 | 4.1 |

| Various parameters | | | | | | | | | |
|---|---|---|---|---|---|---|---|---|---|
| $V_{cha}$ | $V_{dis}$ | $V_{max}$ | $V_{min}$ | $V_{avg}$ | dV | $V_{max}-V_{min}$ | $V_{avg}-V_{max}$ | SOB = 0 ? | SOB = 100 ? |
| 4.2 | 3 | 4.1 | 3.2 | 3.77 | 0.6 | 0.33 | 0.57 | NO | NO |
| X | dV/X | Stdev | N | Y | SOB1 | A | A' | SOB2 | |
| 50 | 0.012 | 0.30348 | 48 | 2 | 4 | 0.47313 | 0.47313 | 4.94625 | |

| Cell including rate for each quantile section | | | | | | | | | |
|---|---|---|---|---|---|---|---|---|---|
| 1 section | 2 section | 3 section | 4 section | 5 section | 6 section | 7 section | 8 section | 9 section | 10 section |
| 0 | 0 | 0 | 0 | 10 | 10 | 10 | 10 | 10 | 10 |
| 11 section | 12 section | 13 section | 14 section | 15 section | 16 section | 17 section | 18 section | 19 section | 20 section |
| 20 | 20 | 20 | 20 | 40 | 40 | 40 | 40 | 40 | 50 |
| 21 section | 22 section | 23 section | 24 section | 25 section | 26 section | 27 section | 28 section | 29 section | 30 section |

TABLE 2-continued

| 50 | 50 | 50 | 50 | 50 | 50 | 50 | 80 | 80 | 80 |
|---|---|---|---|---|---|---|---|---|---|
| 31 section | 32 section | 33 section | 34 section | 35 section | 36 section | 37 section | 38 section | 39 section | 40 section |
| 90 | 90 | 90 | 90 | 90 | 90 | 90 | 90 | 90 | 90 |
| 41 section | 42 section | 43 section | 44 section | 45 section | 46 section | 47 section | 48 section | 49 section | 50 section |
| 90 | 90 | 90 | 90 | 90 | 90 | 90 | 100 | 100 | 100 |

Referring to Table 2, it may be appreciated that a difference between the maximum voltage $V_{max}$ and the minimum voltage $V_{min}$ among the measured voltages for each cell of the second battery is 0.33, which is significantly large compared to the difference of 0.0013 between the maximum voltage $V_{max}$ and the minimum voltage $V_{min}$ of the first battery described above. In addition, it may be appreciated that the measured voltages of all cells of the second battery are included only in the 48th section of the quantile section. Applying the method described above with reference to FIGS. 2 to 4, the primary state-of-balance value by voltage SOB1 is calculated as 4, and SOB2 obtained by applying the correction factor to the SOB1 is calculated as 4.94625. Accordingly, a value of about 4.95% of the state-of-health SOH based on the remaining capacity of the second battery may be estimated as the state-of-health by balance $SOH_{balance}$.

Referring to FIG. 6, the measured voltages of the battery cells of the second battery are distributed over a significantly wide range with respect to the average voltage, and accordingly, it may be appreciated that the state-of-balance by voltage is significantly low.

As a result, the second battery includes a number of battery cells having a voltage charging capability of 4.1V close to 4.2V, which is a fully charged voltage $V_{cha}$, and the first battery includes battery cells having a voltage charging capability of 3.712V, which is relatively, rather lower than 4.2V, which is a fully charged voltage $V_{cha}$. However, the cells of the second battery have a relatively low level of voltage balancing between the cells as compared to the first battery, and accordingly, it may be appreciated that actual efficiency of the state-of-health of the battery is significantly lower than that of the first battery having a high level of voltage balancing among the battery cells.

Figure 7:
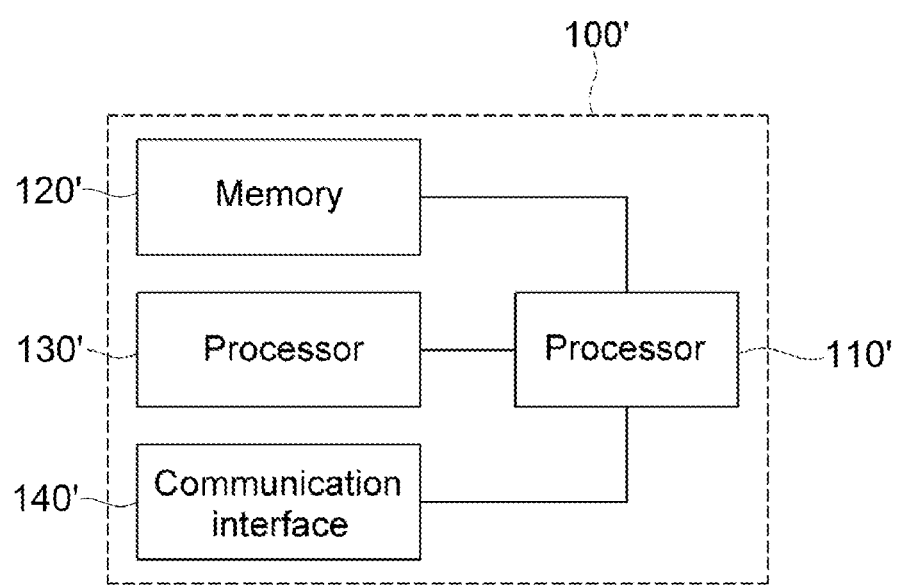
FIG. 7 is a block diagram illustrating a device of estimating a state-of-charge of a battery according to another embodiment of the present disclosure.

FIG. 7 is a block diagram illustrating a device of estimating a state-of-charge of a battery according to another embodiment of the present disclosure.

A device 100' of estimating a state-of-charge of a battery illustrated in FIG. 7 may be a computing device operated by at least one processor. In addition, the device 100' of estimating a state-of-charge of a battery may execute a program including instructions provided to execute an operation according to an embodiment of the present disclosure.

As illustrated in FIG. 7, a hardware of the device 100' of estimating a state-of-health of a battery may include at least one processor 110', a memory 120', a storage 130', and a communication interface 140', and each of the components may be connected via a bus. In addition, the device 100' of estimating a state-of-charge of a battery may further include an additional hardware such as an input device and an output device.

In addition, in the device 100' of estimating a state-of-charge of a battery, various software including an operating system capable of driving a program may be loaded in a storage device such as the storage 130.

The processor 110' is a device for controlling operation of the computing device 100', and may be various types of processors (e.g., a central processing unit (CPU), a micro processor unit (MPU), a micro controller unit (MCU), and a graphic processing unit (GPU)) to execute instructions included in the program.

The memory 120' may load a corresponding program so that the instructions written to execute an operation according to the present disclosure may be processed by the processor 110. For example, the memory 120' may be a read only memory (ROM), a random access memory (RAM), or the like.

The storage 130' may store various data and programs required to execute the operation according to the present disclosure. In such a case, the storage 130' may match a result data processed according to the execution of the program with a measurement data input through a previously interlocked or connected device (e.g., a battery management system (BMS), etc.) for each battery, and may store it as a database. In such a case, the storage 130' stores a "voltage-SOC correlation table" through which a remaining capacity (e.g., SOC) value corresponding to a battery voltage measured for each battery may be checked.

The communication interface 140' may be a wired/wireless communication module that processes communication between each component of the computing device 100' and communication with an externally interlocked device.

Figure 8:
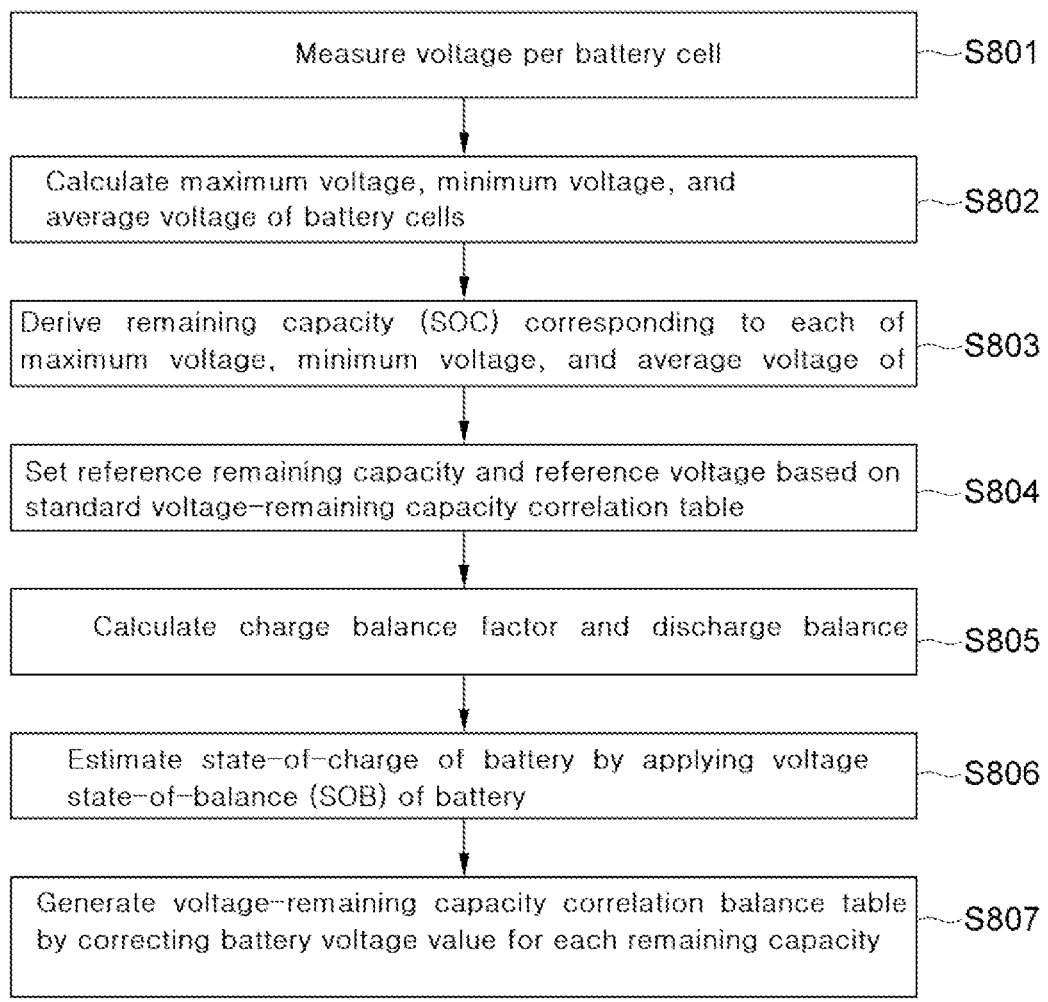
FIG. 8 is a flowchart illustrating a method of estimating a state-of-charge of a battery based on the degree of voltage balancing according to another embodiment of the present disclosure.
Figure 9:
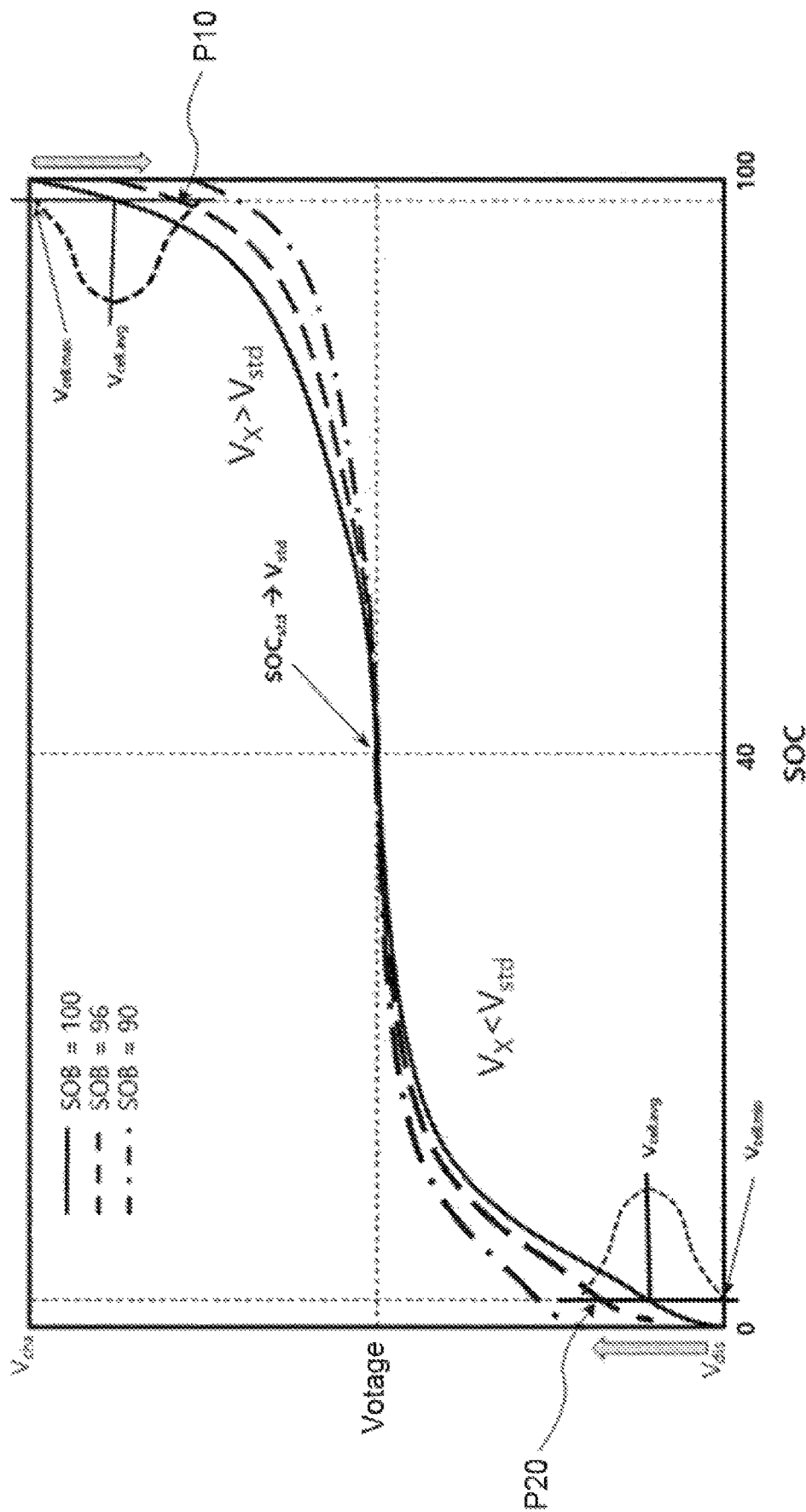
FIG. 9 illustrates an example of a battery charge/discharge state graph for explaining a method of estimating a state-of-charge of a battery reflecting a state-of-health by cell voltage according to another embodiment of the present disclosure.
Figure 10:
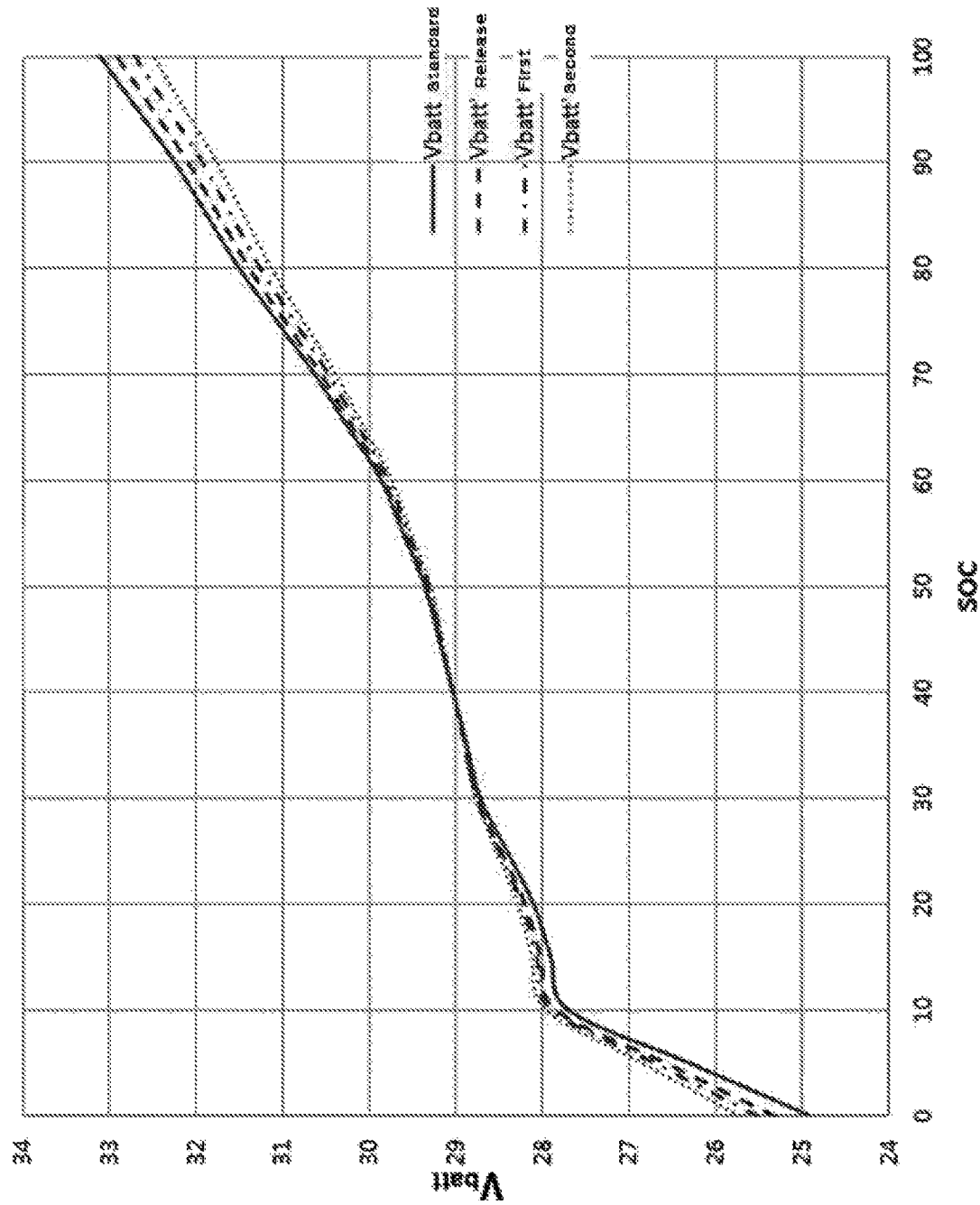
FIG. 10 is another example of a battery charge/discharge state graph for explaining a method of estimating a state-of-charge of a battery reflecting a state-of-health by cell voltage according to another embodiment of the present disclosure.

FIG. 8 is a flowchart for explaining a process of estimating, by the device of estimating a state-of-charge of a battery, the state-of-charge of the battery based on the degree of voltage balancing according to another embodiment of the present disclosure. FIG. 9 illustrates an example of a graph for explaining a meth d of estimating a state-of-charge of a battery reflecting a state-of-balance by cell voltage according to another embodiment of the present disclosure. FIG. 10 is another example of a graph for explaining a meth d of estimating a state-of-charge of a battery reflecting a state-of-balance by cell voltage according to another embodiment of the present disclosure.

The device 100' of estimating a state-of-charge of a battery according to another embodiment of the present disclosure estimates a state-of-charge of the battery by measuring a voltage of the battery, a voltage of each battery cell, and a temperature; stores the estimated result data into a standard state-of-charge table; and applies degree of balancing of cell voltages based on initial values of the standard state-of-charge table to correct the state-of-charge table.

Accordingly, it is possible to accurately estimate the state-of-charge SOC of the battery reflecting actual use conditions for the battery and to display it so that the user may check it. For reference, the device 100' of estimating a state-of-charge of a battery may classify the SOC into predetermined units and display it so that an expected battery use period according to the SOC information of the battery may be checked. Based on the units of expected battery use period of the battery, the battery may be used stably before the battery is recharged.

As the battery is used repeatedly, the lifespan of the battery (that is, usable capacity) decreases, and the inaccuracy of expected product use period according to the battery SOC information increases as compared to that of a new product. In particular, when degree of voltage deviation of battery cells increases while the lifespan of the battery is reduced, charging may be stopped before the battery's usable capacity is fully charged, or discharging may be stopped before the battery's usable capacity is fully discharged. Accordingly, the inaccuracy of the expected battery use period according to the SOC information may further increase, and the SOC information and the expected battery use period are unreliable.

In such a case, user inconvenience may be reduced by correcting the SOC determination standard by applying the actual voltage deviation of the battery cell and re-displaying information on the corrected SOC reference and an expected battery use period based thereon.

Referring to FIG. 8, the processor 110' may process the following operations by executing a series of instructions included in the program, and through this, may estimate and output the balance state-of-charge SOC of the battery reflecting the state-of-balance by voltage of the battery cells.

Specifically, referring to FIG. 8, the processor 110' processes the following operations.

A voltage $V_{batt}$ of a battery including n cells (e.g., end cells) and a voltage $V_{cell}$ of each cell are measured in real time (S801). In such a case, values of the battery voltage $V_{batt}$ and the cell voltage $V_{cell}$ may each be obtained from a battery management system (BMS).

Based on the measured voltage (e.g., $V_{cell}$) for each cell, a maximum cell voltage $V_{cell.max}$ which is a voltage of the cell having a highest measured voltage value among the plurality of cells, and a minimum voltage $V_{cell.min}$, which is a voltage of the cell having a lowest measured voltage value are derived, and an average cell voltage $V_{cell.avg}$ is calculated based on the measured voltage values for each of the plurality of cells (S802).

Next, based on values of the maximum cell voltage $V_{cell.max}$, the minimum cell voltage $V_{cell.min}$, and the average cell voltage $V_{cell.avg}$, a maximum cell remaining capacity $SOC_{cell.max}$, a minimum cell remaining capacity $SOC_{cell.min}$, and an average cell remaining capacity $SOC_{cell.avg}$ are derived (S803).

In such a case, the maximum cell remaining capacity $SOC_{cell.max}$, the minimum cell remaining capacity $SOC_{cell.min}$, and the average cell remaining capacity $SOC_{cell.avg}$ matched with the maximum cell voltage $V_{cell.max}$, the minimum cell voltage $V_{cell.min}$, and the average cell voltage $V_{cell.avg}$, respectively, may be derived from a "standard cell voltage-to-remaining capacity correlation table" in which corresponding remaining capacities for each of a plurality of preset standard cell voltages are matched and stored.

As an example, Table 3 below includes a "standard voltage-to-remaining capacity correlation table". That is, in Table 3, the correlation table in which battery voltage values in the "$V_{batt}$ standard" item are matched with each remaining capacity SOC value from 0 to 100 may be the "standard voltage-to-remaining capacity correlation table". In such a case, as shown in Table 3, battery voltage values matched with each SOC value in the "$V_{batt}$ standard" item may mean a preset ideal voltage, that is, a standard voltage.

For reference, a section of the remaining capacity may be classified, for example, in units of 10 (e.g., percentage %) as shown in Table 3, and a remaining capacity section and a real-time change state of the battery voltage for each section may be visualized and output so that the user may intuitively identify it. To this end, the processor 110' may provide a user interface that displays a real-time remaining capacity of the battery, which is a concept including a graphical user interface (GUI).

In an embodiment, in Table 3, not only the correlation between the preset standard voltage and the remaining capacity for the battery, but also a voltage-to-remaining capacity correlation table which changes according to the number of times (e.g., first, second, . . . cycles) of sequential measurement of the battery voltage is further included. In Table 3, the correlation table changed for each battery voltage measurement cycle up to the second cycle is shown as an example value, but the cycle of the voltage-to-remaining capacity correlation table is not limited thereto.

TABLE 3

| SOC | 0 | 5 | 10 | 15 | 20 | 25 | 30 | 35 | 40 | 45 | 50 |
|---|---|---|---|---|---|---|---|---|---|---|---|
| $V_{batt}$ standard | 24.90 | 26.30 | 27.70 | 27.90 | 28.10 | 28.41 | 28.72 | 28.88 | 29.03 | 29.20 | 29.36 |
| $V_{batt'}$ release | 25.31 | 26.57 | 27.83 | 28.01 | 28.19 | 28.47 | 28.75 | 28.89 | 29.03 | 29.18 | 29.32 |
| $V_{batt'}$ First | 25.52 | 26.71 | 27.90 | 28.07 | 28.24 | 28.50 | 28.76 | 28.90 | 29.03 | 29.17 | 29.31 |
| $V_{batt'}$ second | 25.72 | 25.84 | 27.96 | 28.12 | 28.28 | 28.53 | 28.78 | 28.90 | 29.03 | 29.16 | 29.29 |

| SOC | 55 | 60 | 65 | 70 | 75 | 80 | 75 | 90 | 95 | 100 |
|---|---|---|---|---|---|---|---|---|---|---|
| $V_{batt}$ standard | 29.61 | 29.86 | 30.25 | 30.63 | 31.07 | 31.50 | 31.88 | 32.25 | 32.688 | 33.11 |
| $V_{batt'}$ release | 29.58 | 39.82 | 30.19 | 30.55 | 30.97 | 31.38 | 31.73 | 32.09 | 32.50 | 32.91 |
| $V_{batt'}$ primary | 29.55 | 29.78 | 30.12 | 30.47 | 30.86 | 31.25 | 31.59 | 31.92 | 32.31 | 32.70 |
| $V_{batt'}$ secondary | 29.52 | 29.74 | 30.03 | 30.39 | 30.76 | 31.13 | 31.45 | 31.76 | 32.13 | 32.50 |

As described above, the maximum cell remaining capacity $SOC_{cell.max}$, the minimum cell remaining capacity $SOC_{cell.min}$, and the average cell remaining capacity $SOC_{cell.avg}$ matched with the maximum cell voltage $V_{cell.max}$, the minimum cell voltage $V_{cell.min}$, and the average cell voltage $V_{cell.avg}$, respectively, may be derived from the "standard cell voltage-to-remaining capacity correlation table". For example, an arbitrary battery (e.g., lithium ion battery) described in Table 3 may be a battery module in which 8 end cells are connected in series.

In such a case, when the maximum cell voltage $V_{cell.max}$ of the battery measured at the time of release (e.g., the first cycle) of the battery is 3.63, the measured voltage $V_{batt}$ of the battery is "3.63*8=29.04", so the remaining capacity of 40 is derived from the immediately previous voltage-to-remaining capacity correlation table (that is, a standard voltage-to-remaining capacity correlation table before correction), and the value of the maximum cell remaining capacity $SOC_{cell.max}$ is set to 40. In addition, for the same battery, when the minimum cell voltage $V_{cell.min}$ measured at the time of release is 3.57, the measured voltage $V_{batt}$ of the battery is "3.57*8=28.56", so the remaining capacity of 25 is derived from the standard voltage-to-remaining capacity correlation table, and the value of the minimum cell remaining capacity $SOC_{cell.min}$ is set to 25. In addition, for the same battery, when the average cell voltage $V_{cell.avg}$ measured at the time of release is 3.62, the measured voltage $V_{batt}$ of the battery is "3.62*8=28.96", so the remaining capacity of 35 is derived from the standard voltage-to-remaining capacity correlation table, and the value of the average cell remaining capacity $SOC_{cell.avg}$ is set to 35. That is, it may be appreciated that the degree of state-of-balance by voltage among cells in one battery in the same measurement cycle, that is, the state-of-balance SOB by voltage, is significantly low.

Then, a charge period in which the battery voltage rises and a discharge period in which the battery voltage falls are classified, and a reference remaining capacity $SOC_{std}$ for setting a fixed reference of the remaining capacity and voltage is set for each battery voltage measurement cycle (S804). Then, a standard voltage corresponding to the reference remaining capacity $SOC_{std}$ is derived from the "standard cell voltage-to-remaining capacity correlation table" and is set as the reference voltage $V_{std}$ (S804).

In such a case, the reference remaining capacity $SOC_{std}$ may be set as a remaining capacity value at a point where the charge/discharge period is changed in the first voltage measurement cycle, and may be set to a central value such as, for example, the remaining capacity of 40 or 50, but embodiments of the present disclosure are not limited thereto. In addition, the processor 110' may provide a user interface which allows the user to directly set the reference remaining capacity $SOC_{std}$ to which the fixed reference voltage is to be applied for each battery measurement cycle.

In FIG. 9, the reference remaining capacity $SOC_{std}$ is set to 40 by way of example, and accordingly, the value of the battery voltage $V_{batt}$ is set to 29.03 in the standard voltage-to-remaining capacity correlation table of Table 3.

When the battery is in use, the voltage of each cell is changed within a battery use range from a preset discharged-state voltage $V_{dis}$ to a fully charged-state voltage $V_{cha}$. That is, according to the use of the battery, a voltage change state (e.g., a charge/discharge state) of the battery may be displayed in a graph form as illustrated in FIGS. 9 and 10.

In such a case, referring to FIG. 9, it may be appreciated that as the reference remaining capacity $SOC_{std}$ and the reference battery voltage measurement cycles increase, the state-of-balance SOB by voltage of the battery is changed, and accordingly, the value (e.g., the measured voltage) of the battery charge/discharge graph is changed for the same remaining capacity SOC for each cycle. That is, as the state-of-balance SOB by voltage of the battery is lowered, with respect to the reference remaining capacity $SOC_{std}$, the measured voltage $V_{batt}$ value of the battery for the same remaining capacity SOC may be lowered in the charge period and the measured voltage $V_{batt}$ value of the battery for the same remaining capacity SOC may be increased in the discharge period.

Next, a charge balance factor C and a discharge balance factor D are calculated (S805).

The charge balance factor C and the discharge balance factor D are factors for correcting the voltage-to-remaining capacity by applying the change in the state-of-balance SOB by voltage for each battery voltage measurement cycle as described above to estimating the state-of-charge SOC.

The charge balance factor C is for applying a current state-of-balance SOB by voltage of the battery to the charge period and may be calculated through Equation 12 below.

$$C = \frac{(SOC_{cell.max} - SOC_{cell.avg})}{100} \qquad < \text{Equation 12} >$$

The charge balance factor C means a ratio of the maximum cell remaining capacity $SOC_{cell.max}$ and the average cell remaining capacity $SOC_{cell.avg}$ derived from the maximum cell voltage $V_{cell.max}$ value and the average cell voltage $V_{cell.avg}$ value, respectively. In such a case, the charge balance factor C may satisfy the condition of $0 \leq C \leq 1$.

The discharge balance factor D is for applying the current state-of-balance SOB by voltage of the battery to the discharge period and may be calculated through Equation 13 below.

$$D = \frac{(SOC_{cell.avg} - SOC_{cell.min})}{100} \qquad < \text{Equation 13} >$$

The discharge balance factor D means a ratio of the minimum cell remaining capacity $SOC_{cell.min}$ and the average cell remaining capacity $SOC_{cell.avg}$ derived from the minimum cell voltage $V_{cell.min}$ value and the average cell voltage $V_{cell.avg}$ value, respectively. In such a case, the discharge balance factor D may satisfy the condition of $0 \leq D \leq 1$.

Then, by applying each of the previously calculated parameters, estimating of the remaining capacity SOC of the battery to which the state-of-balance by voltage according to the currently measured battery voltage is applied is performed (S806). Through this, the battery voltage of the immediately previous "voltage-to-remaining capacity correlation table" is corrected according to the currently measured state-of-balance SOB by voltage of the battery, thereby generating and providing a voltage-to-remaining capacity correlation balance table (S807).

In such a case, in order to correct the battery voltage corresponding to each remaining capacity SOC by applying the current state-of-balance SOB by voltage of the battery, Equation 14 below may be applied.

$$V'_{std} = V_{std},$$

$$V_X > V_{std} \rightarrow V'_X = V_{std} + (1-C)(V_X - V_{std}),$$

$$V_X < V_{std} \rightarrow V'_X = V_{std} + (1-D)(V_X - V_{std}) \qquad < \text{Equation 14} >$$

In Equation 14, $V_X$ means a voltage value at SOC X.

In such a case, when the measured battery voltage $V_x$ exceeds the preset reference voltage $V_{std}$ (that is, when $V_x > V_{std}$), it is the charge period of the battery, and the battery voltage $V_x$ corresponding to the state-of-charge SOC X in the immediately previous voltage-to-remaining capacity correlation table is corrected (e.g., changed) into a balance battery voltage V'x by applying the reference voltage $V_{std}$ and the charge balance factor C.

In addition, when the measured battery voltage $V_x$ is lower than the preset reference voltage $V_{std}$ (that is, when $V_x<V_{std}$), it is the discharge period of the battery, and the battery voltage $V_x$ corresponding to the state-of-charge SOC X in the immediately previous voltage-to-remaining capacity correlation table is corrected (e.g., changed) into a balance battery voltage V'$_x$ by applying the reference voltage $V_{std}$ and the discharge balance factor D.

For example, FIG. 10 is a graph illustrating data according to each voltage-to-remaining capacity correlation table included in Table 3.

Referring to Table 3 and FIG. 10, when the maximum cell voltage $V_{cell.max}$ is 3.63, the minimum cell voltage $V_{cell.min}$ is 3.57, and the average cell voltage $V_{cell.avg}$ is 3.62 in the battery release stage measurement (e.g., the first cycle), the maximum cell remaining capacity $SOC_{cell.max}$, the minimum cell remaining capacity $SOC_{cell.min}$, and the average cell remaining capacity $SOC_{cell.avg}$ derived from the immediately previous voltage-to-remaining capacity correlation table (that is, the standard voltage-to-remaining capacity correlation table) are SOC 40, SOC 25 and SOC 35, respectively.

Accordingly, using Equations 1 and 2, the charge balance factor C is "(40−35)/100=0.05" and the discharge balance factor D is "(35−25)/100=0.1" in the corresponding battery measurement cycle. In such a case, when the measured voltage $V_{batt}$ of the battery is 28.96, the corresponding remaining capacity SOC in the immediately previous voltage-to-remaining capacity correlation table (that is, the standard voltage-to-remaining capacity correlation table) is 35, so SOC X of 35 and $V_x$ of 28.88 may be derived.

When the conditions of SOC X=35, $V_x$=28.88, C=0.05 and D=0.1 as described above are applied to Equation 3, "V'$_x$=29.03+(1−0.1)(28.88−29.03)=28.89", and at the remaining capacity SOC of 35, the battery voltage of 28.88 is corrected to be 28.89. In other words, in the voltage-to-remaining capacity correlation table at the release stage (first cycle), the voltage corresponding to SOC 35 is changed to 28.89. The voltage value for each SOC in the voltage-to-remaining capacity correlation table of the release stage (first cycle) corrected in such a manner is the voltage-to-remaining capacity correlation balance table to which the charge balance factor C and the discharge balance factor D are applied (that is, the state-of-balance by voltage is reflected), and may be used as an initial value when correcting the voltage-to-remaining capacity correlation table in the next cycle (e.g., second cycle).

In FIG. 9, a case where, if the state-of-balance SOB by voltage of the battery corresponding to the standard voltage-to-remaining capacity correlation table is 100, the state-of-balance SOB by voltage in the first battery voltage measurement (e.g., the release stage) is 96, and the state-of-balance SOB by voltage in the second battery voltage measurement is 90 is shown by way of example.

As such, in the first battery measurement, since the state-of-balance SOB by voltage is lowered to 96 compared to the previous one, and the voltage value corresponding to the remaining capacity SOC 100 in the standard voltage-to-remaining capacity correlation table is lowered to a first voltage (P10), a charge upper limit in the corrected voltage-to-remaining capacity correlation balance table becomes lower as compared to the standard voltage-to-remaining capacity correlation table.

In addition, since the voltage value corresponding to the remaining capacity SOC 0 in the standard voltage-to-remaining capacity correlation table increases up to a second voltage P20, a discharge lower limit in the corrected voltage-to-remaining capacity correlation balance table becomes higher as compared to the standard voltage-to-remaining capacity correlation table.

In an embodiment, the charge balance factor C and the discharge balance factor D may be calculated based on the battery voltage measured in each of the charge period (e.g., $V_x>V_{std}$) and the discharge period (e.g., $V_x<V_{std}$) classified with respect to the set reference remaining capacity $SOC_{std}$.

In other words, the voltage-to-remaining capacity correlation balance table may be re-corrected by using the charge balance factor C which is calculated based on the battery voltage value measured at a stage where the battery voltage is close to SOC 100 within a preset range, that is, at the charge upper limit stage, in the voltage-to-remaining capacity correlation table finally corrected after release.

In addition, the voltage-to-remaining capacity correlation balance table may be re-corrected by using the discharge balance factor D which is calculated based on the battery voltage value measured at a stage where the battery voltage is close to SOC 0 within a preset range, that is, at the discharge lower limit stage, in the final voltage-to-remaining capacity correlation table.

As described above, by calculating the charge balance factor C and the discharge balance factor D according to the battery voltage values measured in the upper charge limit stage and the lower discharge limit stage, respectively, it is possible to estimate the state-of-charge of the battery more accurately.

In an embodiment, before S807 of estimating the state-of-charge of the battery by applying the state-of-balance SOB by voltage described above, calculating of a reference balance factor S may be further processed.

The reference balance factor S means the degree of balancing between the reference remaining capacity $SOC_{std}$ and each SOC and may be used to assign weights to the state-of-balance SOB by voltage calculated based on the reference remaining capacity $SOC_{std}$.

In such a case, the reference balance factor S may be calculated using Equation 15 below.

$$S=SOC_{std}/100 \qquad \text{<Equation 15>}$$

For example, when the reference remaining capacity $SOC_{std}$ is set to 50, the reference balance factor S may be 0.5, and when the reference remaining capacity $SOC_{std}$ is set to 30, the reference balance factor S may be 0.3.

In such a case, if the state-of-balance by voltage of the battery in the discharge period, that is, SOC0 to $SOC_{std}$, is denoted as $SOB_{low}$, and the state-of-balance by voltage of the battery in the charge period, that is, $SOC_{std}$ to SOC100, is denoted as $SOB_{high}$, the state-of-balance SOB by voltage of the battery may be calculated by Equation 16 below.

$$SOB=S(SOB_{low})\pm(1-S)(SOB_{high}) \qquad \text{<Equation 16>}$$

The methods of estimating battery state according to embodiments of the present disclosure described above may also be implemented in the form of a recording medium including instructions executable by a computer, such as a program module executed by a computer. Such computer-readable media may be any available media that may be accessed by a computer and includes, for example, all of volatile and nonvolatile, removable and non-removable media. In addition, such computer-readable media may also include computer storage media, which includes all of volatile and non-volatile, removable and non-removable media embodied in any method or technology for storage of information, such as computer-readable instructions, data structures, program modules, or other data.

Although the present disclosure has been illustrated and described in connection with exemplary embodiments for illustrating the principles of the present disclosure, the present disclosure is not limited to the configuration and operation as illustrated and described as such. Rather, it will be apparent to those skilled in the art that many changes and modifications may be made to the present disclosure without departing from the spirit and scope of the appended claims.

What is claimed is:

1. A device of estimating a balance state-of-health of a battery, the device comprising:
    a battery management system configured to measure voltage values of a plurality of cells constituting the battery;
    a memory configured to load a program for estimating the balance state-of-health of the battery in its entirety based on a state-of-health (SOH) of the battery and a state-of-balance (SOB) by voltage, wherein the SOH is a remaining capacity of the battery in its entirety, and the SOB by voltage is determined based on a voltage balance state of the voltage values of the plurality of cells of the battery measured by the battery management system; and
    a processor configured to execute instructions included in the program loaded by the memory,
    wherein according to executing of the program, the processor is configured to:
    set a voltage difference allowable limit value less than or equal to a voltage difference between a fully charged-state voltage and a discharged-state voltage of the battery,
    set an allowable limit quantile value based on which an allowable voltage limit range determined based on the voltage difference allowable limit value with respect to an average voltage value is subclassified into one or more analysis sections, the average voltage value being calculated based on the voltage values of the cells measured by the battery management system,
    determine a quantile drop rate based on the allowable limit quantile value, the quantile drop rate being a voltage drop rate in the allowable voltage limit range with respect to the average voltage value,
    determine a quantile degree, which is a degree of one of the analysis sections in which the voltage values measured for each cell are all included within a voltage range of the one of the analysis sections for a first time,
    determine the SOB by voltage based on the quantile drop rate and the quantile degree,
    estimate and output the balance state-of-health of the battery in its entirety based on the voltage balance state of the battery by applying the SOB by voltage to the SOH of the battery such that the balance state-of-health and the SOH for the battery in its entirety at a voltage measurement point in time are different from each other based on a difference between the voltage values of the plurality of cells, and
    stop charging and discharging of the battery based on the balance state-of-health of the battery in its entirety.

2. The device of claim 1, wherein the processor provides a user interface which allows a user to set at least one of the voltage difference allowable limit value and the allowable limit quantile value.

3. The device of claim 1, wherein the processor is configured to:
    calculate a reference deviation voltage value which is a voltage difference per the allowable limit quantile value,
    calculate a correction factor value based on a standard deviation calculated based on the average voltage and a number of cells forming the plurality of cells, the reference deviation voltage value, and the quantile degree,
    calculate a secondary SOB by voltage obtained by adding a primary SOB by voltage, which is a SOB by voltage calculated based on the quantile drop rate and the quantile degree, to a product of the correction factor value and the quantile drop rate, and estimate the balance state-of-health by applying the secondary SOB by voltage to the SOH.

4. The device of claim 3, wherein in calculating of the secondary SOB by voltage,
    the processor is configured to:
    when the correction factor value is negative, change the correction factor value to a zero (0) value and apply it, and when the correction factor value is positive, apply the correction factor value as it is.

5. The device of claim 1, wherein the processor is configured to:
    set the voltage difference allowable limit value to be greater than a value obtained by dividing an operation voltage range value, which is a difference between the fully charged-state voltage and the discharged-state voltage, by a number of cells forming the plurality of cells, and to be less than a value obtained by dividing the operation voltage range value by two.

6. The device of claim 1, wherein the processor is configured to:
    sequentially increase the quantile degree, which is a variable, in units of integer within a range from 1 to the allowable limit quantile value,
    calculate a range from a value obtained by subtracting, from the average voltage value, a product of the quantile degree and a value obtained by dividing the voltage difference allowable limit value by the allowable limit quantile value, to a value obtained by adding the product thereof to the average voltage value,
    derive a quantile degree in which the voltage values measured for each cell are all included within the calculated range for the first time, and
    calculate the SOB by voltage based on the derived quantile degree.

7. The device of claim 6, wherein the processor is configured to:
    when the voltage values measured for each cell are not all included within the calculated range while the quantile degree, which is a variable, increases to the allowable limit quantile value, determine the SOB by voltage to be zero (0).

8. A method of estimating a balance state-of-health of a battery, the method comprising:
    measuring, by a battery management system, voltage values of a plurality of cells constituting the battery;
    setting, by a processor, a voltage difference allowable limit value less than or equal to a voltage difference between a fully charged-state voltage and a discharged-state voltage of the battery including a plurality of cells constituting the battery;
    setting, by the processor, an allowable limit quantile value based on which an allowable voltage limit range determined based on the voltage difference allowable limit value with respect to an average voltage value is subclassified into one or more analysis sections, the average voltage value being calculated based on the voltage values of the cells measured by the battery management system;

calculating, by the processor, a quantile drop rate based on the allowable limit quantile value, the quantile drop rate being a voltage drop rate in the allowable voltage limit range with respect to the average voltage value;

determining, by the processor, a quantile degree which is a degree of one of the analysis sections in which the voltage values measured for each cell are all included within a voltage range of the one of the analysis sections for a first time;

calculating, by the processor, a state-of-balance (SOB) by voltage based on the quantile drop rate and the quantile degree;

estimating and outputting, by the processor, the balance state-of-health of the battery in its entirety, based on a voltage balance state of the voltage values of the plurality of cells of the battery measured by the battery management system, by applying the SOB by voltage to a state-of-health (SOH) such that the balance state-of-health and the SOH for the battery in its entirety at a voltage measurement point in time are different from each other based on a difference between the voltage values of the plurality of cells; and stopping charging and discharging of the battery based on the balance state-of-health of the battery in its entirety, wherein the SOH is a remaining capacity of the battery in its entirety, and the SOB by voltage is determined based on the voltage balance state of the voltage values of the plurality of cells of the battery measured by the battery management system.

9. The method of claim 8, further comprising:
before setting of the voltage difference allowable limit value,
providing a user interface which allows a user to set at least one of the voltage difference allowable limit value and the allowable limit quantile value; and
receiving an input of at least one of the voltage difference allowable limit value and the allowable limit quantile value through the user interface.

10. The method of claim 9, wherein the estimating of the balance state-of-health comprises:
calculating a reference deviation voltage value, which is a voltage difference per the allowable limit quantile value,
calculating a correction factor value based on a standard deviation calculated based on the average voltage and a number of cells forming the plurality of cells, the reference deviation voltage value, and the quantile degree,
calculating a secondary SOB by voltage obtained by adding a primary SOB by voltage, which is a SOB by voltage calculated based on the quantile drop rate and the quantile degree, to a product of the correction factor value and the quantile drop rate, and
estimating the balance state-of-health by applying the secondary SOB by voltage to the SOH.

11. The device of claim 1, wherein the balance state-of-health value is proportional to at least one of the SOB or the SOH.

12. The device of claim 1, wherein the processor is further configured to manage a degree of voltage balance between the plurality of cells of the battery based on the balance state-of-health of the battery in its entirety.

* * * * *